(12) United States Patent
Goto

(10) Patent No.: US 11,687,685 B2
(45) Date of Patent: Jun. 27, 2023

(54) CAD PLOTTING METHOD OF EQUALLY DIVIDING AN ANGLE

(71) Applicant: Kimiji Goto, Yokohama (JP)

(72) Inventor: Kimiji Goto, Yokohama (JP)

( * ) Notice: Subject to any disclaimer, the term of this patent is extended or adjusted under 35 U.S.C. 154(b) by 0 days.

(21) Appl. No.: 17/382,779

(22) Filed: Jul. 22, 2021

(65) Prior Publication Data

US 2022/0027527 A1 Jan. 27, 2022

(30) Foreign Application Priority Data

Jul. 26, 2020 (JP) ................................ 2020-126042

(51) Int. Cl.
*G06F 30/10* (2020.01)
*G06T 11/20* (2006.01)

(52) U.S. Cl.
CPC ............ *G06F 30/10* (2020.01); *G06T 11/203* (2013.01)

(58) Field of Classification Search
None
See application file for complete search history.

(56) References Cited

FOREIGN PATENT DOCUMENTS

| JP | 395901 A | 4/1991 |
| JP | 2001131593 A | 5/2001 |

OTHER PUBLICATIONS

Bruckheimer, M.; A Herrick Among Mathematicians or Dynamic Geometry as an Aid to Proof; May 2001; International Journal of Computers for Mathematical Learning; vol. 6; p. 113-125. (Year: 2001).*

Stammler, L.; Cutting Circles and the Morley Theorem; 1997, month unknown; Contributions to Algebra and Geometry; vol. 38, p. 91-93. (Year: 1997).*

* cited by examiner

*Primary Examiner* — Joni Hsu
(74) *Attorney, Agent, or Firm* — Flynn Thiel, P.C.

(57) ABSTRACT

A CAD plotting method of equally dividing an optional angle which is capable of reducing a plotting error so as to be fitted for a practical use with a simple plotting procedure, as compared to a conventional plotting method.

4 Claims, 20 Drawing Sheets

FIG.5
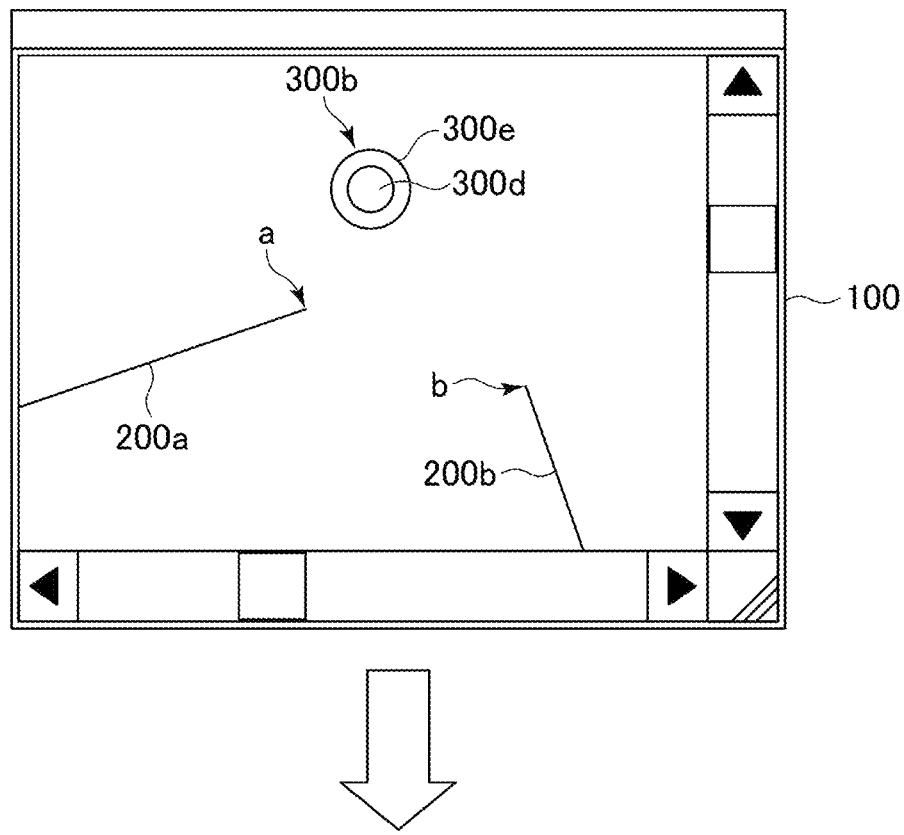
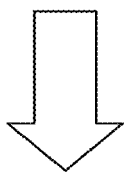
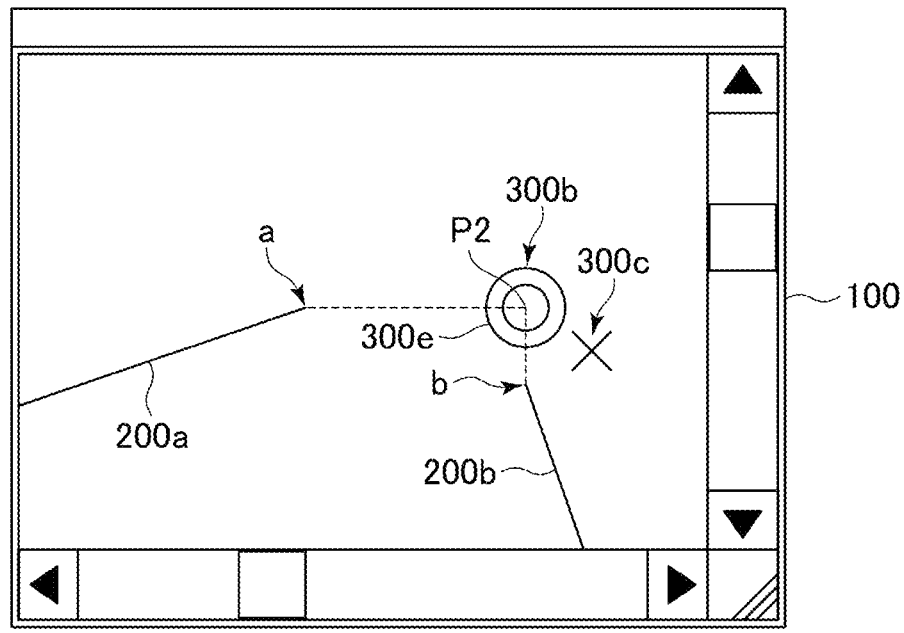

FIG.9B
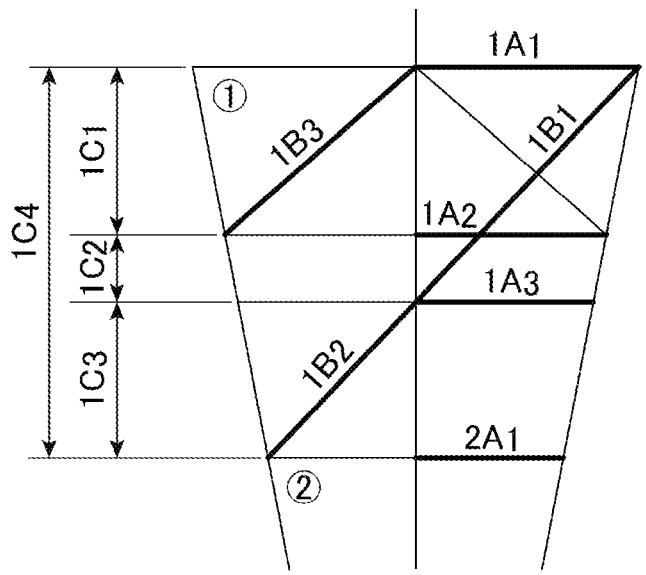
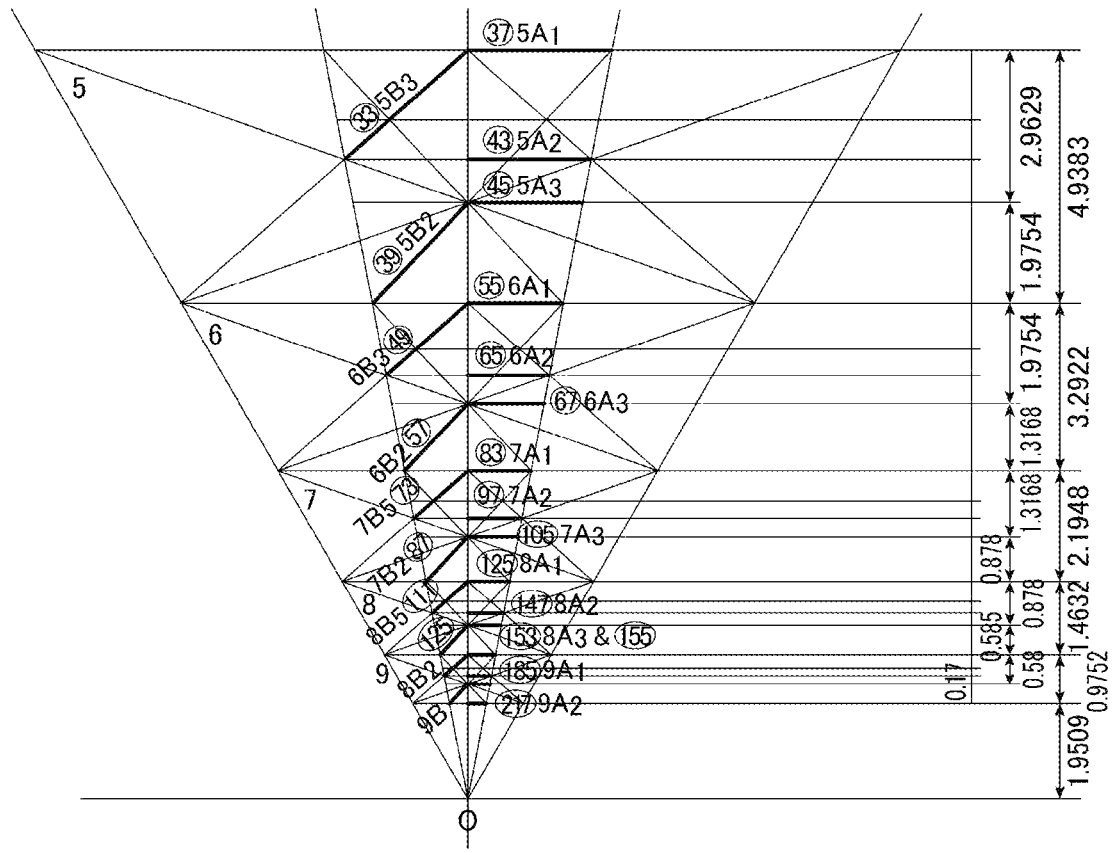

FIG.10A
(A)
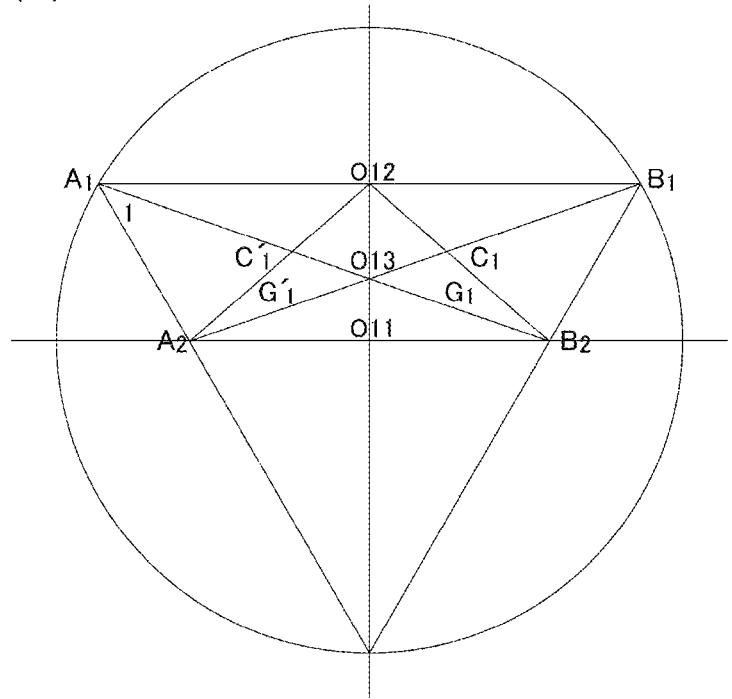
(B)
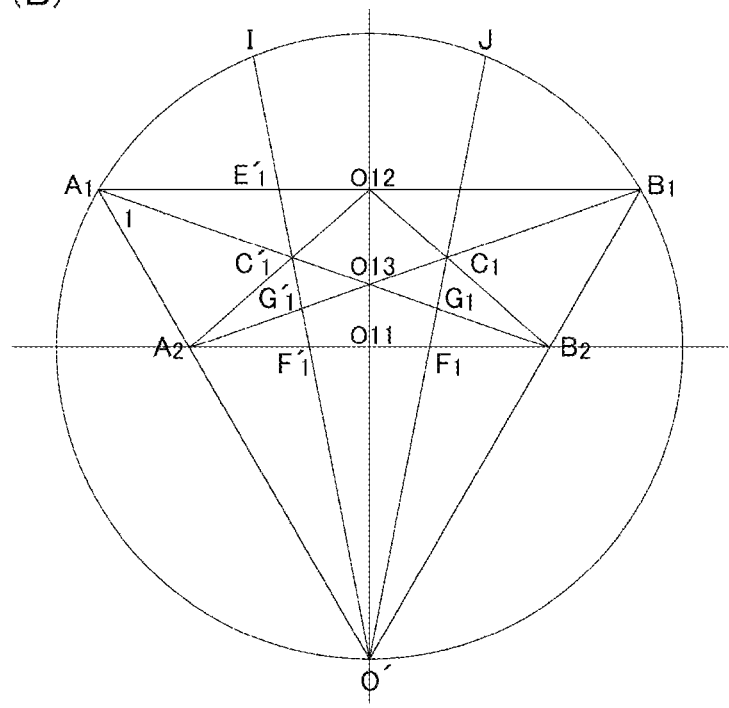

FIG.10B
(C)
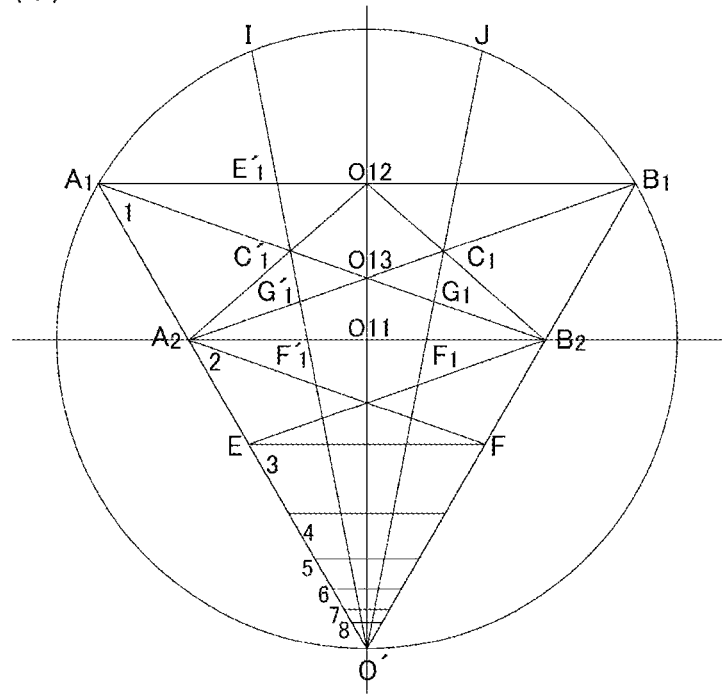
(D)
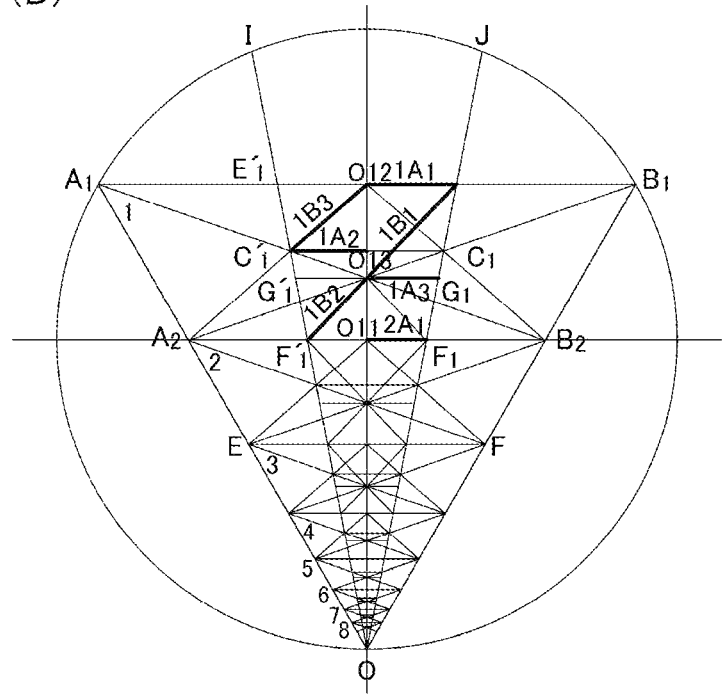

FIG.11A

| NUMBER OF DIVISION | B2*3 | LENGTH 100*3.14 | REFERENCE LINE | LENGTH | PLOTTING ERROR (%) |
|---|---|---|---|---|---|
| 3 | 9 | 34.90659 | FG | 34.7 | 1.005953 |
| 5 | 15 | 20.94395 | 1B1 | 20.8173 | 1.006084 |
| 7 | 21 | 14.95238 | 1A1 | 14.78765 | 1.01114 |
| 9 | 27 | 11.62963 | 1A3 | 11.5473 | 1.00713 |
| 11 | 33 | 9.515152 | 2A1 | 9.622786 | 1.011312 |
| 13 | 39 | 8.051282 | 2A2 | 8.06364 | 1.001535 |
| 15 | 45 | 6.977778 | 3B3 | 7.274044 | 1.0303 |
| 17 | 51 | 6.156863 | 3B2 | 6.167978 | 1.0018 |
| 19 | 57 | 5.508772 | 3A2 | 5.498736 | 1.001825 |
| 21 | 63 | 4.984127 | 3A3 | 4.82422 | 1.033147 |
| 23 | 69 | 4.550725 | 2*5A3 | 4.545455 | 1.001159 |
| 25 | 75 | 4.186667 | 4B2 | 4.11197 | 1.018165 |
| 27 | 81 | 3.876543 | 2*6A1 | 3.8745 | 1.000527 |
| 29 | 87 | 3.609195 | 4A2 | 3.6658 | 1.015683 |
| 31 | 93 | 3.376344 | 4A3 | 3.421422 | 1.013351 |
| 33 | 99 | 3.171717 | 5B3 | 3.216148 | 1.014008 |
| 35 | 105 | 2.990476 | 2*6A2 | 3.041246 | 1.016977 |
| 37 | 111 | 2.828829 | 5A1 | 2.851196 | 1.007907 |
| 39 | 117 | 2.683761 | 5B2 | 2.702814 | 1.007099 |
| 41 | 123 | 2.552846 | 2*7A1 | 2.5232 | 1.01175 |
| 43 | 129 | 2.434109 | 5A2 | 2.443882 | 1.004015 |
| 45 | 135 | 2.325926 | 5A3 | 2.280948 | 1.019719 |
| 47 | 141 | 2.22695 | 5A3 | 2.280948 | 1.024247 |
| 49 | 147 | 2.136054 | 6B3 | 2.144099 | 1.003766 |
| 51 | 153 | 2.052288 | 6B1 | 2.102188 | 1.024315 |
| 53 | 159 | 1.974843 | 6A1 | 1.900078 | 1.039348 |
| 55 | 165 | 1.90303 | 6A1 | 1.900078 | 1.001554 |
| 57 | 171 | 1.836257 | 6B2 | 1.818182 | 1.009941 |
| 59 | 177 | 1.774011 | 6B2 | 1.818182 | 1.024899 |
| 61 | 183 | 1.715847 | 5B8 | 1.722009 | 1.003591 |
| 63 | 189 | 1.661376 | 5B3 | 1.659365 | 1.001212 |
| 65 | 195 | 1.610256 | 6A2 | 1.63587 | 1.0159 |
| 67 | 201 | 1.562189 | 6A3 | 1.520632 | 1.02732 |
| 69 | 207 | 1.516908 | 6A3 | 1.520632 | 1.002455 |
| 71 | 213 | 1.474178 | 7B3 | 1.429399 | 1.031327 |
| 73 | 219 | 1.43379 | 7B3 | 1.429399 | 1.003072 |
| 75 | 225 | 1.395556 | 7B3 | 1.429399 | 1.024251 |

FIG.11B

| NUMBER OF DIVISION | B2*3 | LENGTH 100*3.14 | REFERENCE LINE | LENGTH | PLOTTING ERROR(%) |
|---|---|---|---|---|---|
| 77 | 231 | 1.359307 | 2*8A3 | 1.351664 | 1.005655 |
| 79 | 237 | 1.324895 | 2*8A3 | 1.351664 | 1.020205 |
| 81 | 243 | 1.292181 | 7A1 | 1.264198 | 1.0204 |
| 83 | 249 | 1.261044 | 7A1 | 1.264198 | 1.002501 |
| 85 | 255 | 1.231373 | 7B2 | 1.20125 | 1.025076 |
| 87 | 261 | 1.203065 | 7B2 | 1.20125 | 1.001511 |
| 89 | 267 | 1.17603 | 6B8 | 1.148006 | 1.024411 |
| 91 | 273 | 1.150183 | 6B8 | 1.148006 | 1.001896 |
| 93 | 279 | 1.125448 | 6B8 | 1.148006 | 1.020044 |
| 95 | 285 | 1.101754 | 7A2 | 1.09122 | 1.00967 |
| 97 | 291 | 1.079038 | 7A2 | 1.09122 | 1.01129 |
| 99 | 297 | 1.057239 | 7A2 | 1.09122 | 1.032141 |
| 101 | 303 | 1.036304 | 7A3 | 1.01424 | 1.0217 |
| 103 | 309 | 1.016181 | 7A3 | 1.01424 | 1.001914 |
| 105 | 315 | 0.996825 | 7A3 | 1.01424 | 1.01747 |
| 107 | 321 | 0.978193 | 8B3 | 0.952933 | 1.026508 |
| 109 | 327 | 0.960245 | 8B3 | 0.952933 | 1.007673 |
| 111 | 333 | 0.942943 | 8B3 | 0.952933 | 1.010595 |
| 113 | 339 | 0.926254 | 8B1 | 0.934306 | 1.008693 |
| 115 | 345 | 0.910145 | 8B1 | 0.934306 | 1.02654 |
| 117 | 351 | 0.894587 | 8A1 | 0.84488 | 1.033 |
| 119 | 357 | 0.879552 | 8A1 | 0.84488 | 1.01617 |
| 121 | 363 | 0.865014 | 8A1 | 0.84488 | 1.02383 |
| 123 | 369 | 0.850949 | 8A1 | 0.84488 | 1.00718 |
| 125 | 375 | 0.837333 | 8A1 | 0.84488 | 1.009013 |
| 127 | 381 | 0.824147 | 8A1 | 0.84488 | 1.025157 |
| 129 | 387 | 0.81137 | 9B1 | 0.8091 | 1.0028 |
| 131 | 393 | 0.798982 | 9B1 | 0.8091 | 1.012663 |
| 133 | 399 | 0.786967 | 9B1 | 0.8091 | 1.028124 |
| 135 | 405 | 0.775309 | 8B3 | 0.762671 | 1.0165 |
| 137 | 411 | 0.76399 | 8B3 | 0.762671 | 1.00173 |
| 139 | 417 | 0.752998 | 8B3 | 0.762671 | 1.012847 |
| 141 | 423 | 0.742317 | 8A2 | 0.715935 | 1.036849 |
| 143 | 429 | 0.731935 | 8A2 | 0.715935 | 1.022348 |
| 145 | 435 | 0.721839 | 8A2 | 0.715935 | 1.00824 |
| 147 | 441 | 0.712018 | 8A2 | 0.715935 | 1.0055 |

FIG.12A
(A)
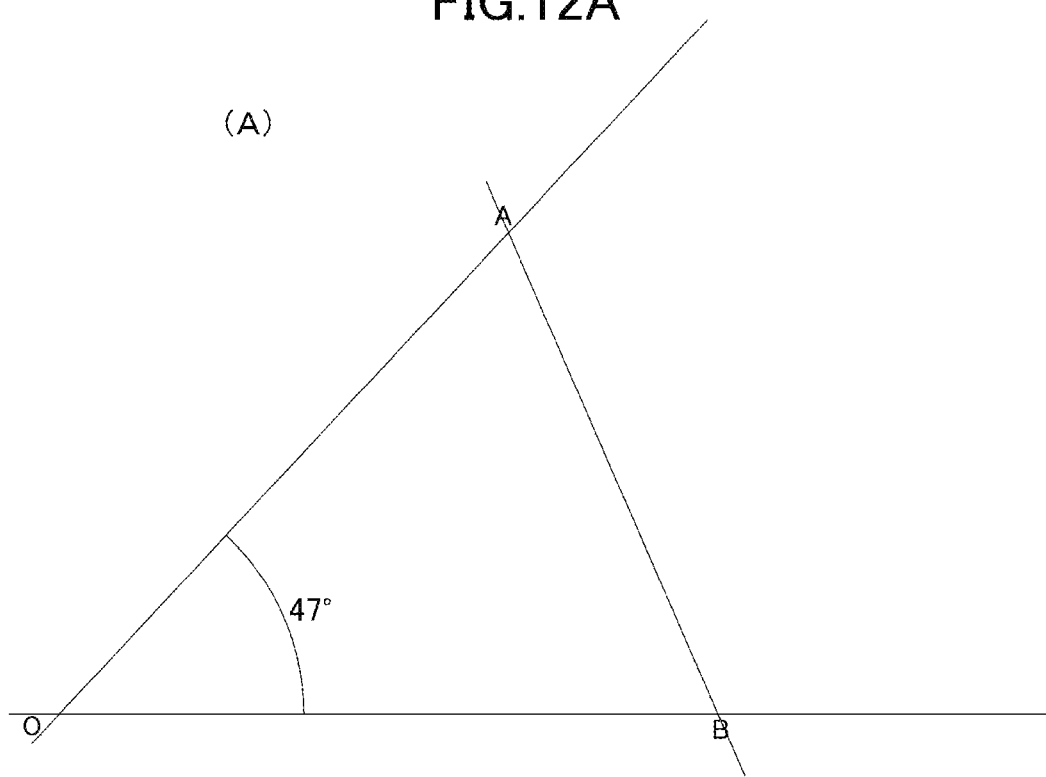
(B)
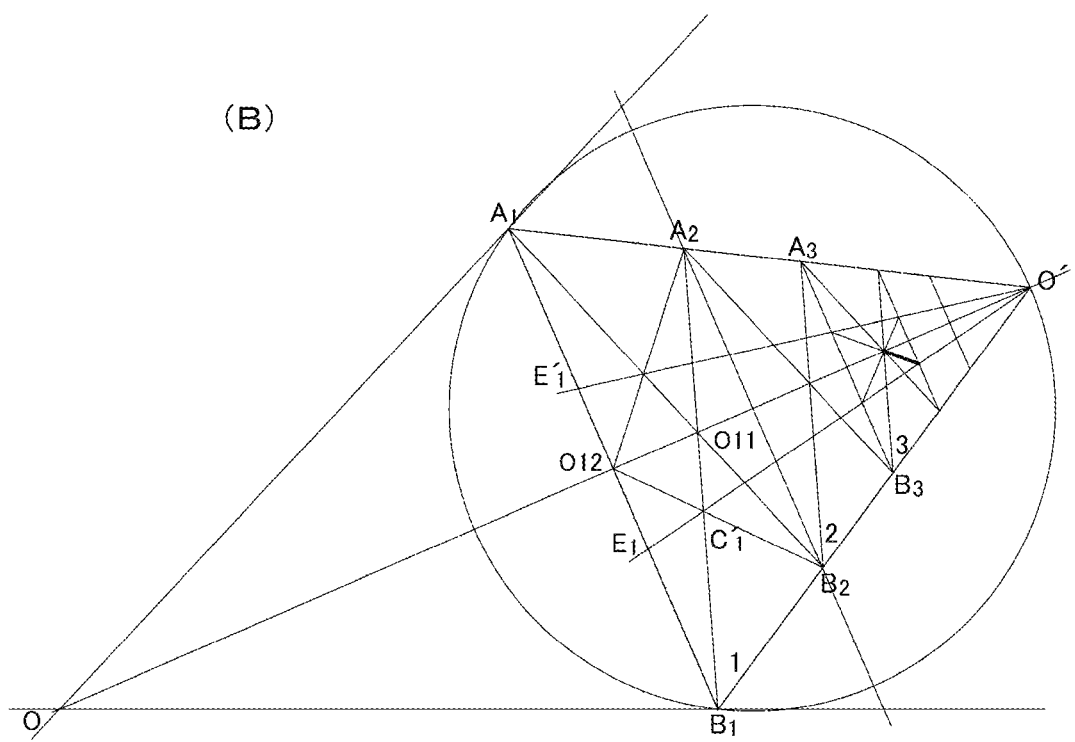

FIG.12B
(C)
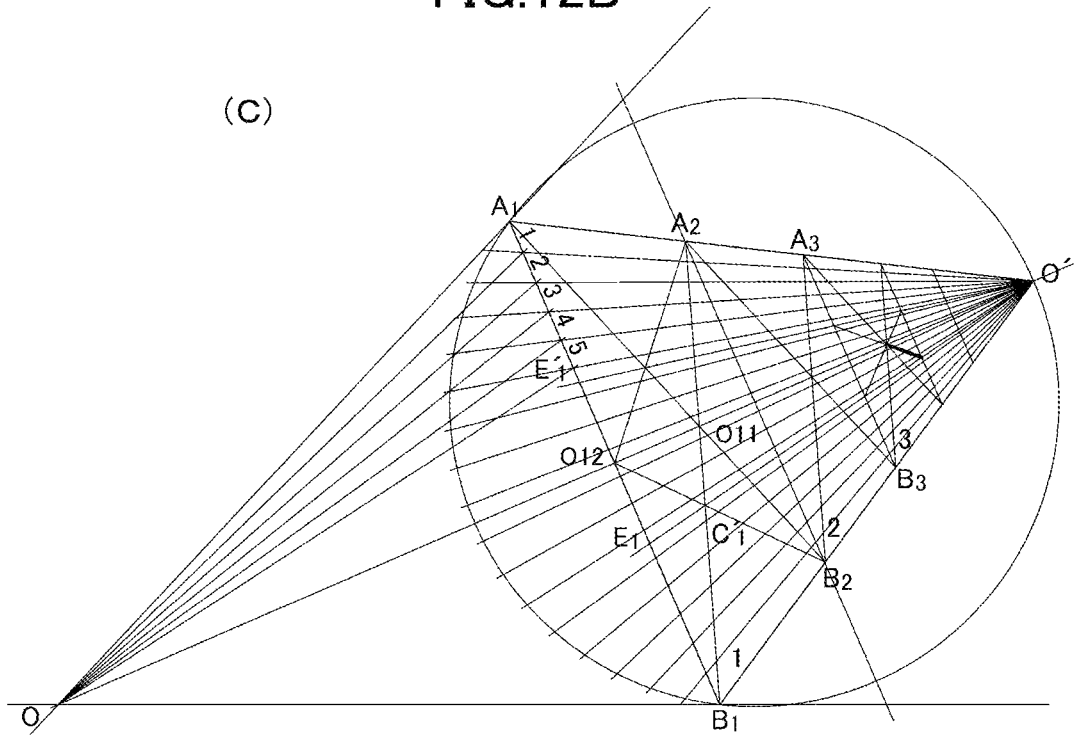
(D)
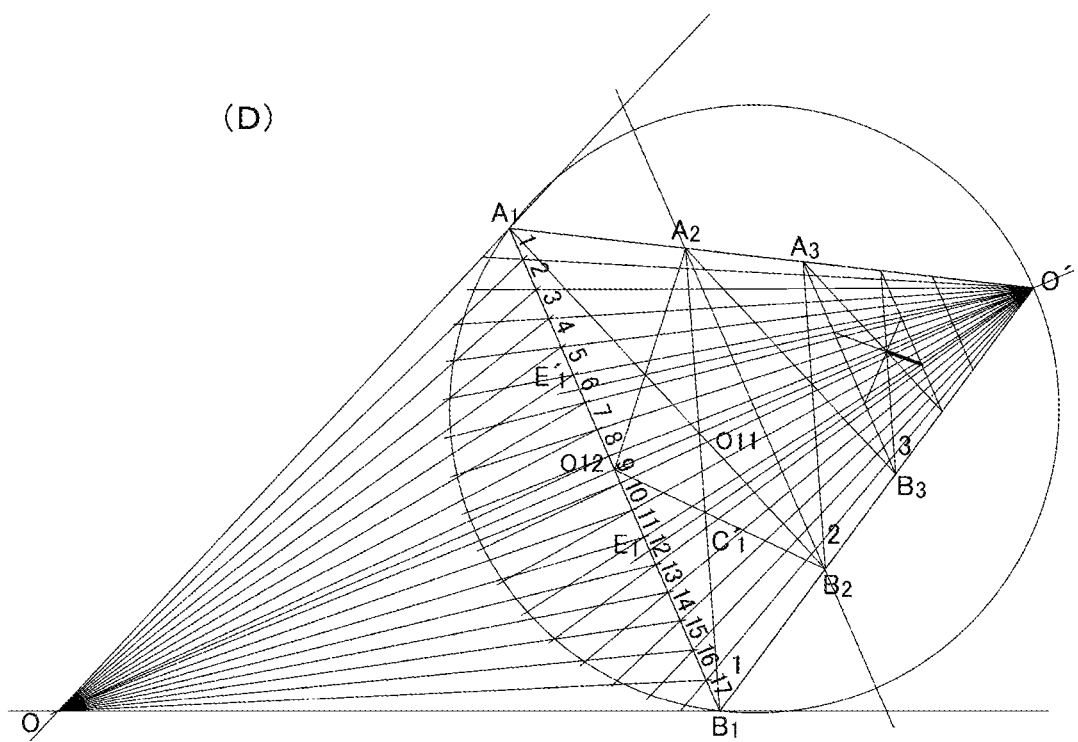

FIG.15A
(A)
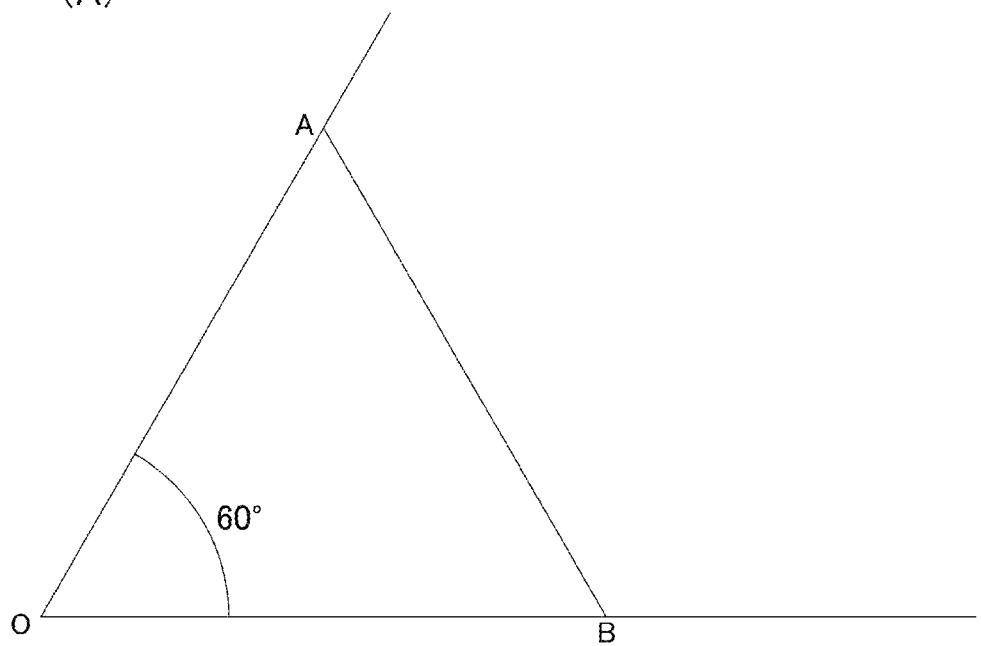
(B)
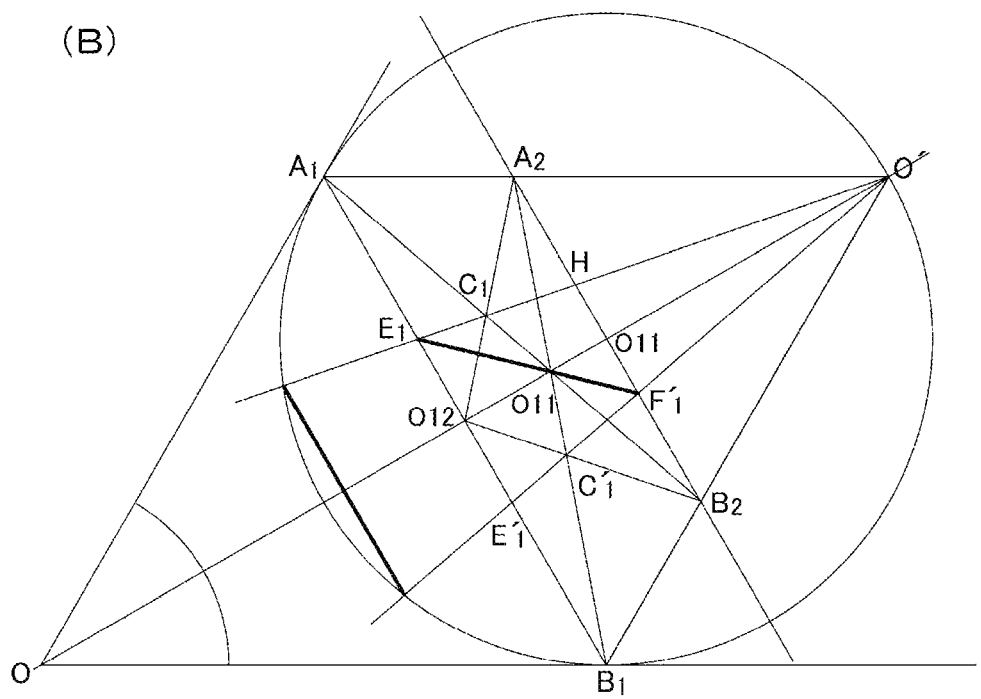

FIG.15B
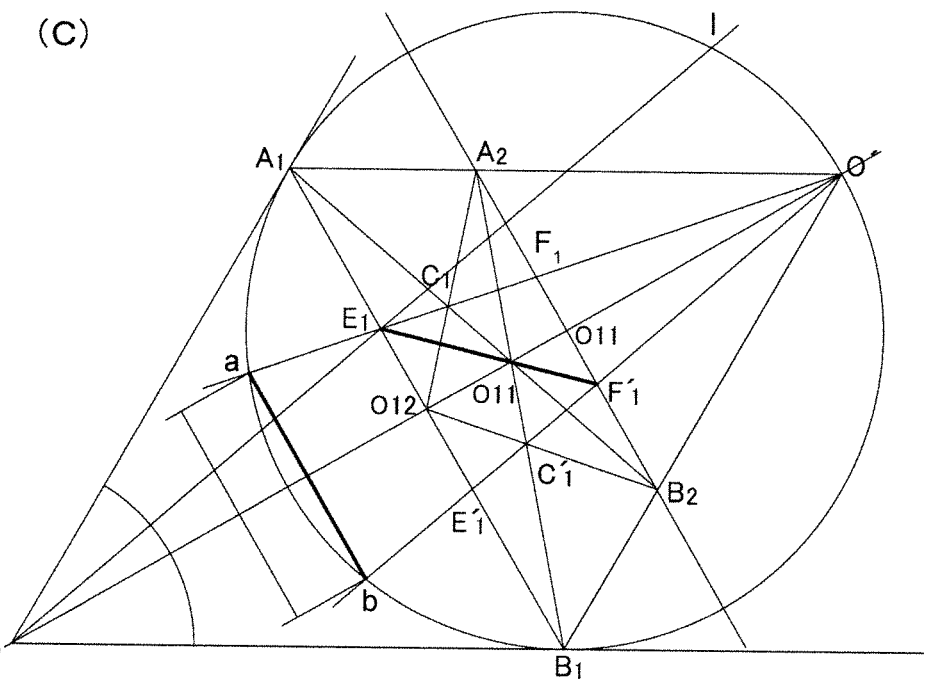
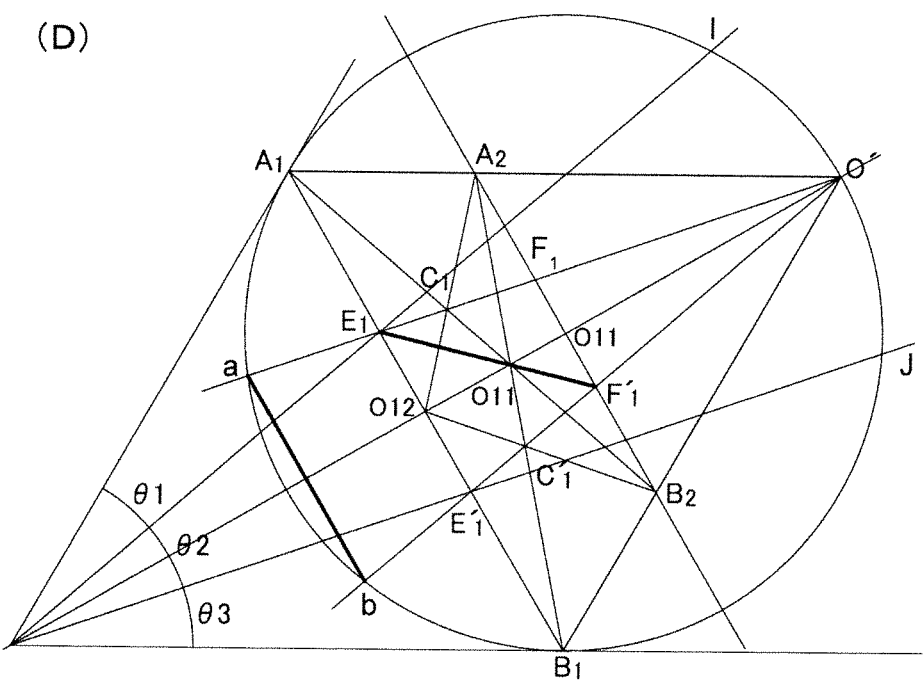

CAD PLOTTING METHOD OF EQUALLY DIVIDING AN ANGLE

TECHNICAL FIELD

The present invention relates to a method of CAD plotting. More specifically, the present invention relates to the method of CAD plotting which is capable of reducing plotting errors in simple plotting procedures so as to improve practicability, as compared to a conventional method of plotting figures, in a case where an optional angle is equally divided by plotting straight lines.

BACKGROUND ART

With respect to an optional angle plotting method in which the optional angle is equally divided by using a compass and a ruler, it has been mathematically proven that the optional angle trisection plotting method, in particular, is not feasible.

More specifically, one of the three plotting method problems in Greece, that is "an optional angle trisection plotting method problem" is whether or not that an optional angle can be equally divided into three parts is feasible. It is widely known that the optional angle trisection plotting method is not possible by a conventional plotting method in which only the compass and the ruler without a scale are used.

However, it is known that the optional angle trisection plotting method is feasible by modifying how to use a plotting gadget, or devising new gadgets such as the plotting method in which a ruler with scales, or the one in which folded papers are used, or the one in which a small gadget which can draw parabola is used.

For example, the Patent Publication 1 discloses an auxiliary instrument for trisecting an optional angle. More specifically, in order to provide the auxiliary instrument which is capable of assisting to trisect the optional angle, the auxiliary instrument includes a rectangular transparent plate one end edge of which is shaped to be arcuate. On an upper surface of the auxiliary instrument, a central line is drawn between an upper end of a one-fourth sectorial shape and a center thereof, and a diagonal line is drawn between the lower end of the central line and the sectorial shape. An indication pin and an axle at which the indication pin is pivotably supported are provided on the plate.

According to the auxiliary instrument, firstly, an optional angle formed by two line OA, OB written on a note, for example, is equally divided into four parts, and a line form O is drawn so as to form 90° relative to the line OA, or OB.

By putting the plate 1 on which a mark trisection line is indicated on the figure and operating the indication needle, based on the principle of the method of trisect division of an optional angle, a mark for drawing a trisect line can be plotted by adding a one-twelfth of the optional angle in question to a one-fourth thereof. Accordingly, such plotting method can be readily carried out.

For example, the Patent Publication 2 discloses a ruler by which an optional straight line is equally divided. More specifically, in order to provide a ruler which is capable of providing a simple plotting method in which an optional straight line is equally divided, the technical feature in a triangle ruler with two sides which intersects at a right angle and an inclined side connecting two sides, a slit is provided along a straight line connecting an intersecting point which one of the two side and the inclined side intersects, and a bisect point which equally divides the other of the two sides.

According to such a ruler, by positioning one side of the right triangle, and drawing a straight work line perpendicular to the one side from a point at which the other side intersects the inclined side, a point at which the straight work line intersects the slit is a target bisect point.

However, in either of the above plotting methods, an optional angle can only be equally divided by using a specific gadget.

In other words, an optional angle can neither be exactly equally divided into three angular parts, nor the optional angle can be equally divided under the practically allowable error in a simple procedure, only by using a compass defining a circle and a ruler defining a straight line.

In particular, in the Patent Publication 2, a plotting gadget which equally divides not an angle, but a straight line is only disclosed.

In CAD, an algorithm for equally dividing an angle is not the one which exactly equally diving the angle, so that, in case where an object is processed into a certain shape by CAM, based on data given by CAD, a regular pyramid whose bottom surface is shaped to be a regular polygon cannot be manufactured in a perfect accurate manner.

Since eleven side surfaces of the regular pyramid, for instance, cannot be processed, a reflection of light on the eleven side surfaces can slightly differ from each other.

Accordingly, a process error is required to be as small as possible in an application of an optical device in which a process optical path matters.

In addition, in CAD, the thickness of the line by which the line on the curve is plotted on a screen is preferred to be as thin as possible.

The more precise the plotting method becomes, the more the thickness of the line is paid attention to.

Therefore, the more precise the plotting method of the angle becomes, the thinner the thickness of the line to be plotted is required to be.

Patent Publication 1: JP2001-131593(A)
Patent Publication 2: JP03-95901(A)

SUMMARY

Therefore, it is an object of the present invention to provide a CAD plotting method of equally dividing an optional angle which is capable of reducing a plotting error so as to be fitted for a practical use with a simple plotting procedure, as compared to a conventional plotting method.

Therefore, it is an object of the present invention to provide a CAD plotting method of equally dividing an optional angle which is capable of thinning of a plotting line so as to be fitted for a practical use with a simple plotting procedure, as compared to a conventional plotting method.

In view of the above technical problems, according to an aspect of the invention, there is provided a CAD plotting method of equally dividing an angle XOY between a line OX and a line OY into three sections, comprising a step of seeking points $A_1$, $B_1$ on the line OX and the line OY, respectively, so as to form a relation $O\,A_1 = O\,B_1$, a step of forming a triangle $A_1OB_1\mathbf{1}$ by connecting a point $A_1\mathbf{1}$ on the line OX and a point $B_1\mathbf{1}$ on the line OY, a step of forming an equilateral triangle $A_1B_1O'$ whose one side is defined by a line $A_1B_1$, a step of drawing a line which passes a center $O_{11}$ of a circle which circumscribes said equilateral triangle $A_1B_1O'$ in parallel with said side $A_1B_1$, seeking points $A_2$, $B_2$ at which said parallel line intersects the line AO' and BO', respectively, and seeking a point $O_{12}$ which is a central point of said side $A_1B_1$, a step of seeking points $C_1'$ and $C_1$ at which $A_2B_1$, $A_1B_1$, $A_1B_2$ intersects $B_2O_{12}$, $A_2O_{12}$, respectively, a step of seeking points $E_1'$ and $E_1$ at which extension lines of $O'C_1$, $O'C_1'$ intersect $A_1B_1$, whereby said side $A_1B_1$ is trisected by said points $E_1'$ and $E_1$, a step of seeking a point $F_1$ at which a line $A_2B_2$ intersects said line $O'C_1$, and a point $F_1'$ at which a line $A_2B_2$ intersects said line $O'C_1'$, a step of seeking points a,b on the circumscribed circle so as to be separated form A, B with a distance corresponding to $F_1E_1'$, or $F_1'E_1$, respectively, a step of seeking points I, J at which the lines aO', bO' intersect the side $A_1$, $B_1$, respectively, and a step of drawing lines OI, OJ, whereby each of angles XOI, IOJ, and JOY corresponds to the trisection angle of XOY.

In view of the above technical problems, according to an aspect of the invention, there is provided a CAD plotting method of equally dividing an angle XOY between a line OX and a line OY into N sections, comprising a step of seeking points $A_1$, $B_1$ on the line OX and the line OY, respectively, so as to form a relation $OA_1=OB_1$, a step of forming a triangle $A_1OB_11$ by connecting a point $A_11$ on the line OX and a point $B_11$ on the line OY, a step of forming an equilateral triangle $A_1B_1O'$ whose one side is defined by a line $A_1B_1$, a step of drawing a line which passes a center $O_{11}$ of a circle which circumscribes said equilateral triangle $A_1B_1O'$ in parallel with said side $A_1B_1$, seeking points $A_2$, $B_2$ at which said parallel line intersects the line AO' and BO', respectively, and seeking a point $O_{12}$ which is a central point of said side $A_1B_1$, a step of seeking points $C_1'$ and $C_1$ at which $A_2B_1$, $A_1B_1$, $A_1B_2$ intersects $B_2O_{12}$, $A_2O_{12}$, respectively, a step of seeking points $E_1'$ and $E_1$ at which extension lines of $O'C_1$, $O'C_1'$ intersect $A_1B_1$, whereby said side $A_1B_1$ is trisected by said points $E_1'$ and $E_1$, a step of seeking a point $F_1$ at which a line $A_2B_2$ intersects said line $O'C_1$, and a point $F_1'$ at which a line $A_2B_2$ intersects said line $O'C_1'$, a step of seeking a point $O_{13}$ at which the line $O'O_{12}$ intersects the side $A_1B_2$ or the side $A_2B_1$, and seeking $G_1$, $G_1'$ at which a line passing the point $O_{13}$ in parallel with the side $A_1B_1$ intersects O'E, O'E', respectively, a step of extracting $O_{21}C_1$, $O_{13}F_1$, $O_{13}E_1$, $O_{12}E_1$, $O_{13}G_1$ and $C_1'C_1$ as a second group of diagonal lines relative to the side $A_1B_1$, in said equilateral triangle $A_1B_1O'$, a step of determining n for the equilateral triangle AnBnO', in accordance with predetermined division number N, and plotting the equilateral triangles $A_1B_1O'$ to AnBnO', a step of selecting either of the first group of straight lines or the second group of straight lines and selecting either of straight lines in the selected group to determine the reference line L, a step of dividing an arc of said circumscribed circle within said triangle $A_1OB_1$ into N parts by using said determined reference line L from $A_1$ or $B_1$, and a step of connecting between each of divided points on the arc of the circumscribed circle, and said point O, whereby said angle XOY is equally divided into N parts.

In a preferred embodiment of the present invention, said step of plotting said equilateral triangle AnBnO' includes a step of positioning said point O' to be an opposite said to said point O relative to said line AB.

In a preferred embodiment of the present invention, said step of plotting the equilateral triangles $A_1B_1O'$ to AnBnO' includes a step of plotting either of said equilateral triangle in a magnifying manner by utilizing a zoom up function.

BRIEF DESCRIPTION OF THE DRAWINGS

FIG. 5 is a view showing an image in a case where equi-X, equi-Y command displayed on the display section of FIG. 2 is executed.

FIGS. 9A and 9B are views showing a group of reference lines used in a CAD plotting procedure according to the embodiment of the present invention.

FIGS. 10A and 10B are views showing a CAD plotting procedure for determining a group of the reference lines to be used.

FIGS. 11A and 11B are a chart showing a corresponding relationship between a group of the reference lines to be used and the number of divisions in the CAD plotting method according to the present invention.

FIGS. 12A and 12B are views showing a CAD plotting procedure in a case where the angle XOY is 47°, and the number of division is 17 in the CAD plotting method according to the present invention.

FIGS. 15A and 15B are views showing a CAD plotting procedure in a case where the angle XOY is 60°, and the number of division is 3 in the CAD plotting method according to the present invention.

DETAILED DESCRIPTION

Figure 1:
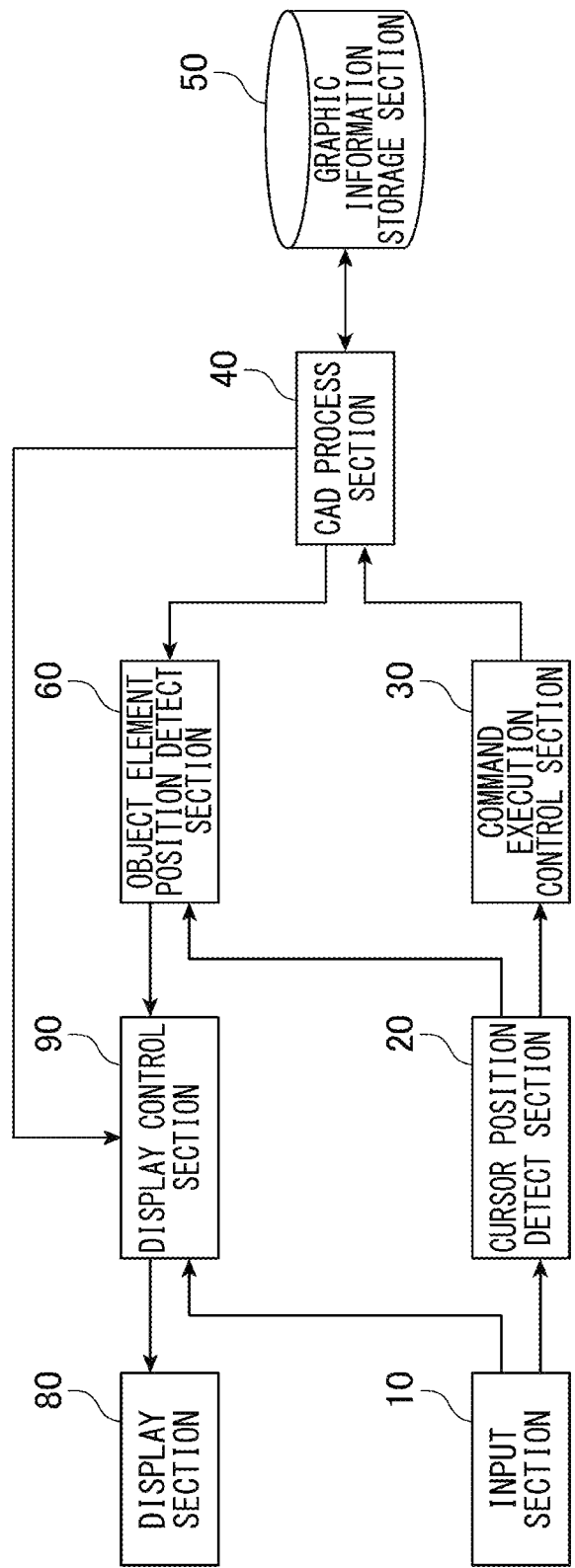
FIG. 1 is a view showing a general CAD system utilized in a plotting method of the embodiment of the present invention.

FIG. 1 is a view showing a functional block view illustrating a section of a basic structure of a CAD system realizing a plotting assisting method of the embodiment of the present invention. An input section 10 is constituted by an input device such as a mouse or a key board. A positional information of the mouse cursor, for instance, input from the input section 10 is detected by a cursor positioning detecting section 20. The cursor positioning information detected by the cursor positioning detecting section 20 is sent to a display control section 90 where the mouse cursor is displayed on a position detected on a display screen of a display section 80 such as CRT device, a liquid crystal display apparatus.

In addition, cursor position information from the cursor position detecting section 20 is given to the command execution section 30 where the command selected from the cursor position detected by the cursor position detecting section 20 and click information from the input section 10 is executed, so that the CAD process section 40 is operated in response to the executed command.

In a case where a command driving menu such as icons is not displayed on the cursor section detected by the cursor position detecting section 20, the command execution section 30 directly gives cursor position information to the CAD process section 40.

The CAD process section 40 carries out the CAD process, based on the information input via the command execution section 30.

With respect to the CAD process section 40, since the CAD process section 40 is a normal type in which a normal CAD process is carried out, a minute explanation on CAD process section 40 is omitted.

In the CAD process section 40, graphic element information is input from graphic element information storage section constituted by storage medium such as an external hard disk device, graphic element information is edited and to be stored in graphic element information storage section 50.

Further, the cursor position information from the cursor position detecting section 20 is given to an object element position detecting section 60. The object element position detecting section 60 detects that the cursor position information detected by the cursor position detecting section 20 captures the object element position.

Here, "an object element position" is defined to be the position of the object element (an intersect point on an extension line, a horizontal or a vertical line, for example) which has a specific positional relationship to one of a plurality of graphic element(s) which has already been plotted and stored in the graphic element information storage section 50, or one of a plurality of graphic element(s) (referred to as "responsive element" hereinafter) which is now being plotted by the CAD process section 40. In this connection "to detect an object element position" means that an object element position is located within a predetermined range about a cursor position. When the object element position detecting section 60 detects that the cursor captures the object element position, the object element position detecting section 60 gives the object element and its position, and information on the responsive element display control section 90.

The responsive element display control section 90 functions to modify the display configuration of the cursor or a responsive element, displayed on the display section 80, and to display an auxiliary line from the responsive element to the object element, based on the information from the object element position detecting section 60 and the display color information which has been already set.

Figure 2:
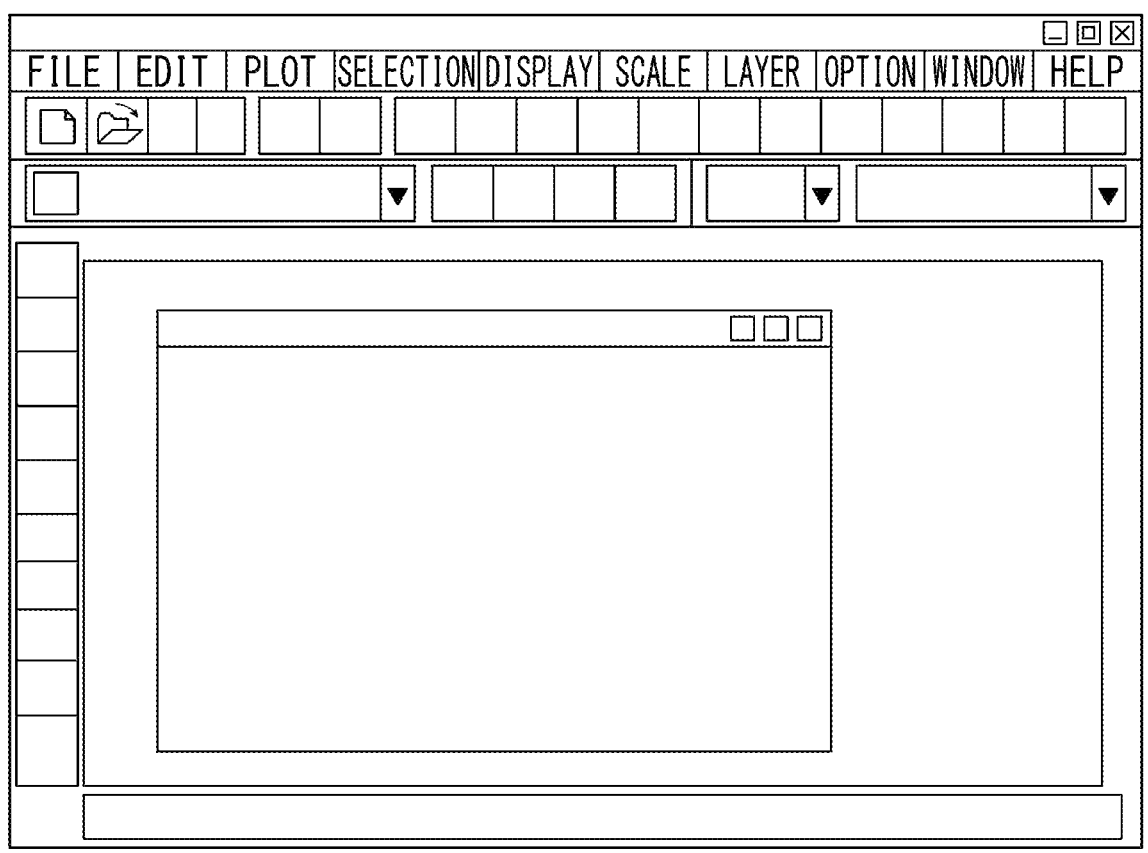
FIG. 2 is a view showing one example of a screen displayed in the display section.

FIG. 2 is a view showing one example of a screen displayed on the display section 80 of the CAD system. This screen includes a graphic display area and a variety of menus display areas.

Figure 3:
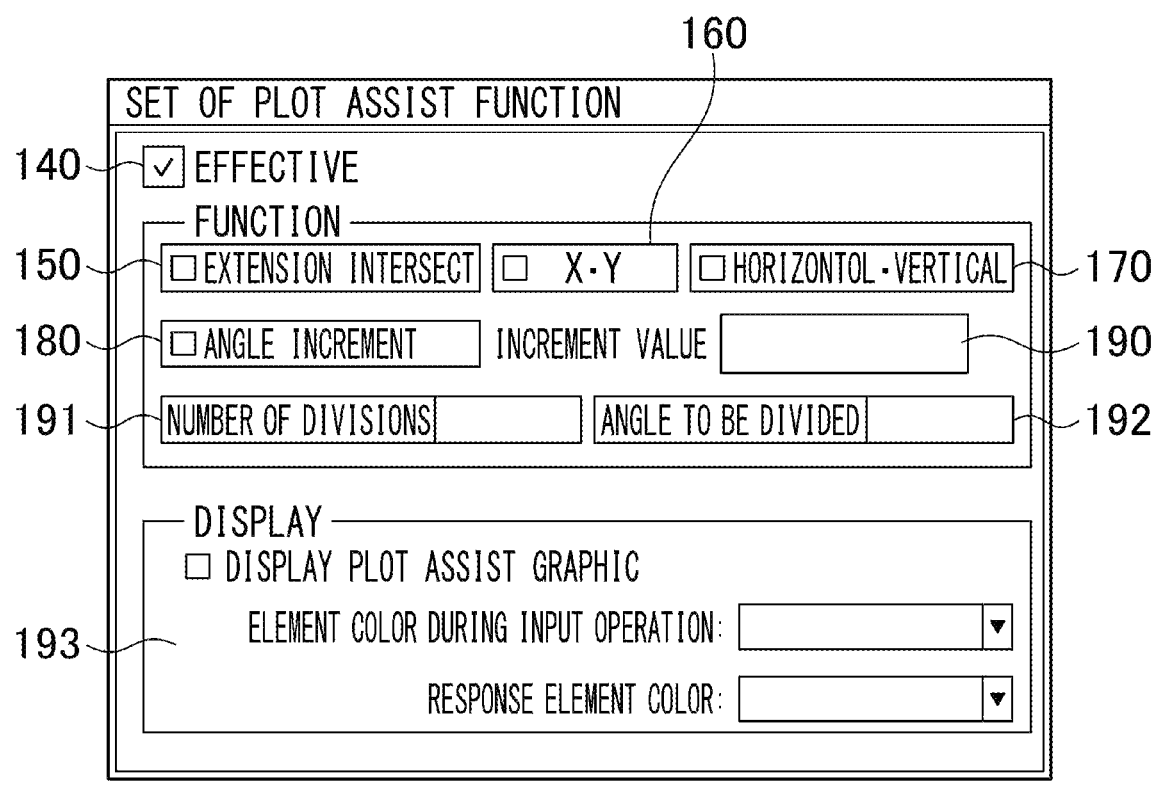
FIG. 3 is a view showing a dialogue box for setting a plot assisting function.

Firstly, a menu for setting "plotting assist function" is selected from the menu displayed area 12 on the screen, a dialogue box for setting plotting function is displayed on the screen, as shown in FIG. 3.

As shown in FIG. 3, the plotting assist function becomes effective by clicking the plotting assist function effectivity check box 140 by a mouse to fill in a check mark. More specifically, the information that the plotting assist function has been selected is sent from the cursor position detecting section 20 to the command execution section 30, the object element position detecting section 60 and the responsive element display control section 90, so that such a plotting assist function becomes effective by 60 being initiated.

There are four commands which the plotting assist function set dialogue box can set. The first command is the extension intersect command 150 which modifies the display configuration of the cursor when the cursor captures the point at which on extension lines of two straight lines, which are the responsive elements, intersect as object elements. The second command is the equi-X•equi-Y command 160 which modifies the display configuration of the cursor when the cursor captures the point at which extension lines along X-axis and Y-axis, respectively, from a pair of the points of the following responsive elements intersect as object elements.

(1) endpoint•central point in case of straight line
(2) central point in case of circle, oval, pole symbol
(3) endpoint•central point in case of arc, a portion of oval
(4) apex in case of a free curve The third command is a horizontal•vertical command 170 which modifies the display configuration of the cursor when the cursor captures the line extending in the horizontal or vertical direction from a plot start point of the graphic element, which is the responsive element, as object elements.

The fourth command is an angular increment command 180 which modifies the display configuration of the cursor when the cursor captures the line extending from a plot start point of the graphic element, which is the responsive element, in the direction identical to that determined by the angular increment which has been already input, as object elements.

When the cursor captures a line extending in the direction from the plotting start point of the graphic element which is the responsive element, since there are four commands such as an angular increment command 180 which modifies the display configuration of the cursor, when either of the check boxes for the commands 150 to 180 is checked, checked commands are executed at the object element position detecting section 60.

In addition, the plotting assist function set dialogue box includes an angular increment input box 190 which inputs an angle in 180 by manually using the key board of the input section 10, for instance.

A box 191 for inputting the number of divisions and a box 192 for inputting the angle to be divided are also provided.

In addition, the display control section 90 controls the display section 80 so as to modify the mouse cursor 300 with a shape of a normal mode to the mouse cursor 300*b* with a shape of a plotting assist function mode.

When the mouse cursor 300*b* captures the object element position, the information display cursor 300*c* which identifies the object element is displayed on a position diagonally lower than that of the mouse cursor 300*b*.

The shape of the information display cursor 300*c* is set in such a way that the content of the object element can be readily visually recognized.

For instance, when the mouse cursor 300*b* captures an existing point such as an endpoint on the responsive element, or a point element, a cruciform shape which shows the existing point as information display cursor is displayed.

When the extension intersect point command, or equi-X, equi-Y command is executed, the cruciform shape is displayed as information display cursor.

When the mouse cursor 300*b* captures the point on the responsive element, a display showing that the point is on the responsive element is carried out as information display cursor.

Likewise, when the horizontal•vertical and the angular increment command are carried out, the horizontal line, the vertical line and the value of the angle is displayed as information display cursor 300*c*, respectively.

Further, the dialogue box for setting the plotting assist function includes a display color setting function which can set the display color of the graphic element displayed on the graphic display area when the plotting assist function becomes effective.

By checking the check box for the plotting assist graphic display, the display color setting function in the display control section 90 becomes effective. With respect to the display color of the graphic element which can be set by this display color setting function, there are two kinds, the one is the display color of the graphic element when the operator is doing input operation by using a mouse, etc., and the other is the display color of the responsive element.

In this case, any display color can be set by using a pull-down means in case of the display color of the graphic element during the input operation, and in case of the display color of the responsive element.

Next, the operation when each of the commands 150 to 180 is executed under the condition that the plotting assist function is effective will be explained about.

Figure 4:
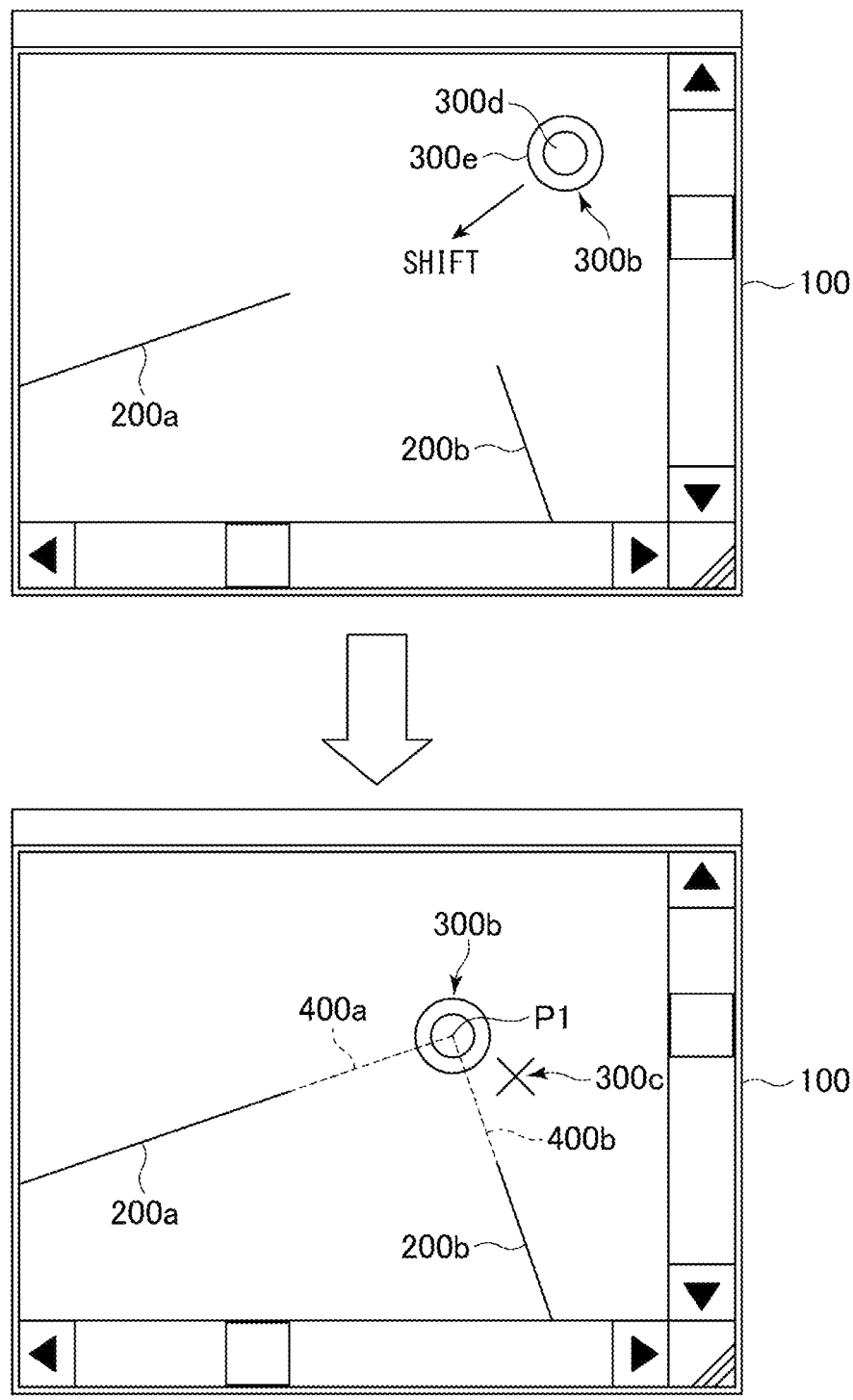
FIG. 4 is a view showing an image in a case where an extension intersect command displayed on the display section of FIG. 2 is executed.

FIG. 4 is a view showing an image when the extension intersect command 150 is executed.

Firstly, the mouse cursor 300b is superimposed on any position on two graphic elements (straight line elements 200a, 200b) displayed on the display window 100 opened in the graphic display area, and thus, the graphic element 200a, 200b is selected/determined by using the mouse click operation.

This selection/determination operation is carried out in order to reduce operation amount due to the identification of the object. If the operation amount does not matter, this operation can be omitted.

In this case, if the intersect point of the extension lines of the straight lines 200a, 200b is not located within a certain area 300e from a central position 300d of the mouse cursor 300b, the information display cursor 300c is not displayed.

Next, the extension intersect point P1 between the straight line elements 200a, 200b enters into the certain area 300e of the mouse cursor 300b by moving the mouse cursor 300b in the direction shown in an arrow in FIG. 4.

When the extension intersect point P1 enters the predetermined area 300e of the mouse cursor 300b, the intersect display shape is displayed near the mouse cursor 300b as the information display cursor 300c, so that the mouse cursor 300b is displayed as being positioned on the point on which the extension of the straight lines 200a, 200b intersects.

For instance, if the operation inputs that the present state is to be fixed, bands 400a, 400b are displayed on extension lines from the straight lines 200a, 200b, respectively, as auxiliary lines, the graphic defined by accurately extending the straight lines 200a, 200b up to the extension intersect point P1 can be readily plotted.

In such a case, the straight lines 200a, 200b are changed into the predetermined responsive colors, while the bands 400a, 400b are also changed into the display configuration different from that of other graphic elements.

FIG. 5 is a view showing an image in a case where equi-X, equi-Y command 160 is executed. Firstly, the mouse cursor 300b is superimposed on any position on the two displayed graphic elements, and thus, the straight line element 200a, 200b are selected by the mouse click. As described above, this operation is optional. In this case, unless the point at which the straight line extending in X-axis from the endpoint a of 200a intersects the straight line extending in Y-axis from the endpoint b of 200b is located within a certain area 300e from the central position 300d of the mouse cursor 300b, the information display cursor 300c is not displayed.

Then, when the mouse cursor 300b is moved in the direction as shown by an arrow in FIG. 5, a point P2 at which the straight lines extending in the X and Y coordinates from the endpoints a, b of the straight line elements 200a, 200b intersect enters in a predetermined area 300e of the mouse cursor 300b.

In such a case, an intersect point display shape as a shape of information display cursor 300c is displayed near the mouse cursor 300b in such a way that the position of the mouse cursor 300b is the same as X-value or Y-value of the endpoints a, b of the straight line elements 200a, 200b.

Accordingly, the graphic can be displayed at the positions of X-value and Y-value, relative to the endpoints a, b of the straight line elements 200a, 200b.

Figure 6:
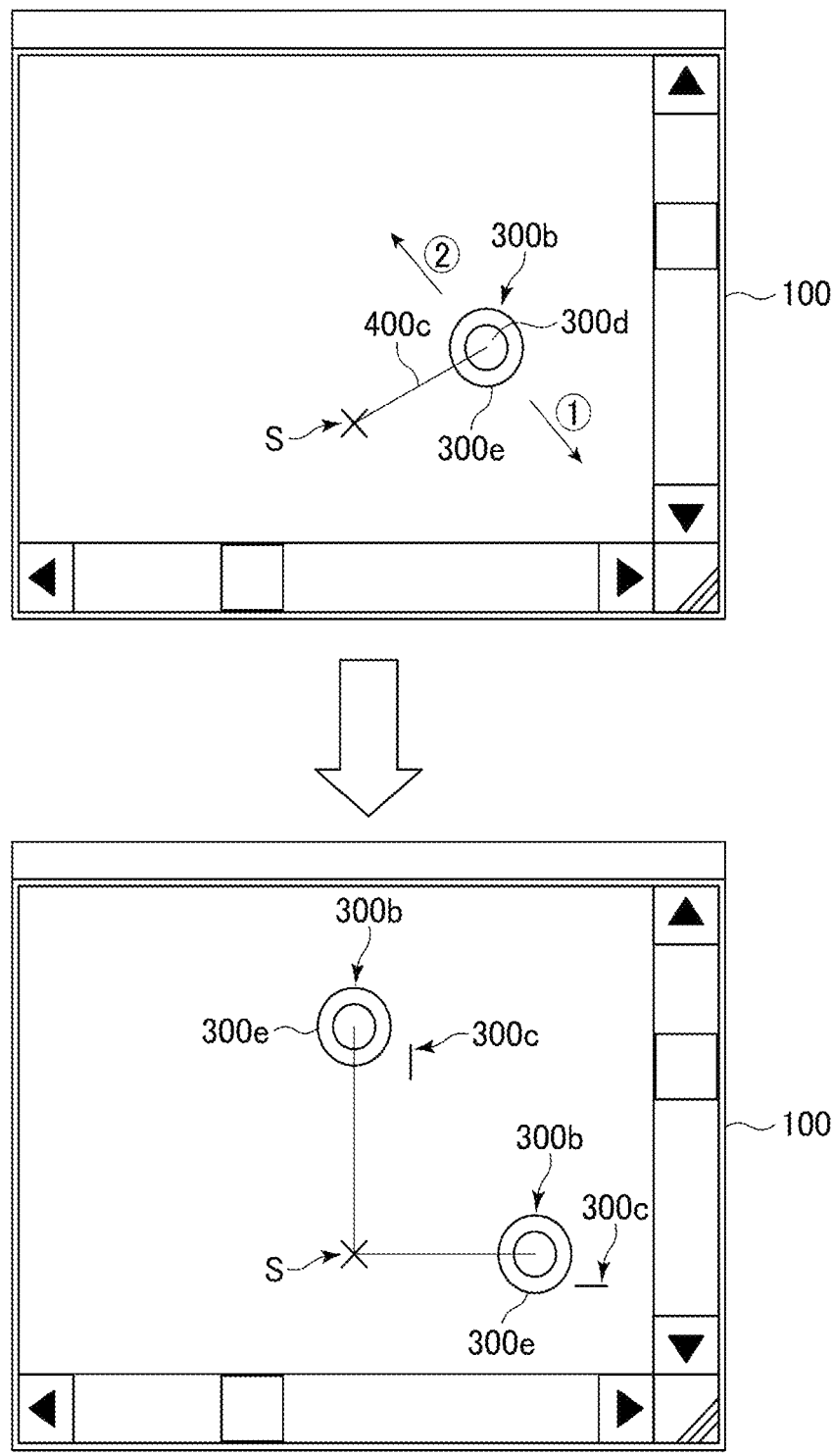
FIG. 6 is a view showing an image in a case where horizontal/vertical command displayed on the display section of FIG. 2 is executed.

FIG. 6 is a view showing an image when a horizontal•vertical command 170 is executed.

Firstly, the start point S of the graphic element diagram is set to be at any position within a display window 100 by the mouse click of the mouse cursor 300b. In such a case, unless the central position 300d of the mouse cursor 300b or a certain area 300e from the central position 300d forms a horizontal•vertical relationship with the start point S, the information display cursor 300c is not displayed.

Then, the mouse cursor 300b is moved in the direction as shown by an arrow (1) or (2) in FIG. 6.

When the start point S and the central position 300d of the mouse cursor 300b enter a certain area 300e of the mouse cursor 300b so as to form a horizontal•vertical positional relationship, a horizontal or vertical display shape as a shape of a information display cursor 300c is displayed near the mouse cursor 300b. If a straight line is plotted under the condition that the information display cursor 300c is a horizontal or vertical display, a horizontal or vertical straight line can be readily plotted without using any auxiliary straight line.

Figure 7:
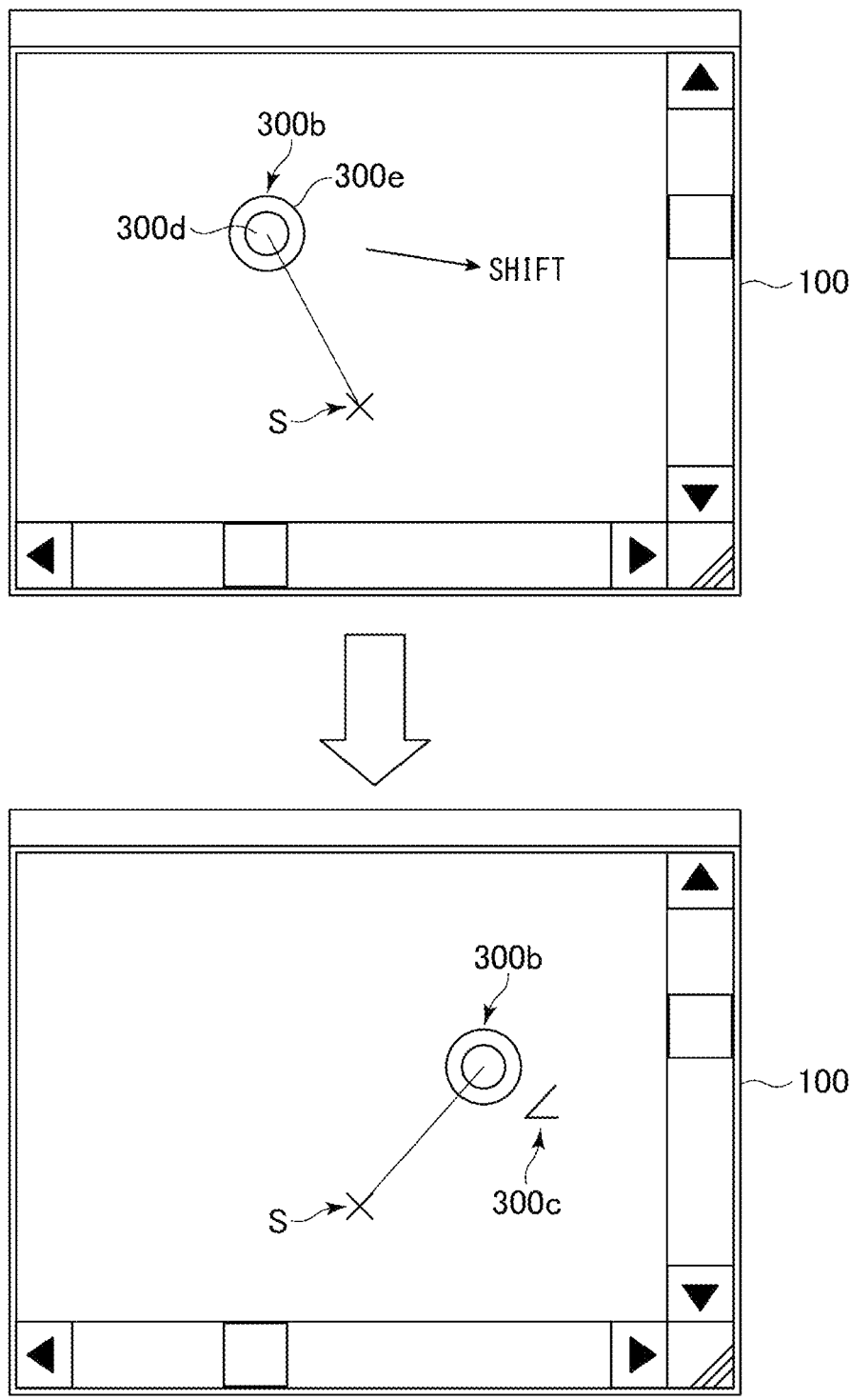
FIG. 7 is a view showing an image in a case where an angular incremental command displayed on the display section of FIG. 2 is executed.

FIG. 7 is a view showing an image when an angular incremental command 180 is executed. Firstly, the start point s of the graphic element diagram is set to be any position within a display window 100 by the mouse click of the mouse cursor 300b.

Next, any angle is input in an angular incremental value input box 190 of the plot assist function set dialogue box.

For instance, in a case where 45° is set, unless the central position 300d of the mouse cursor 300b, or the certain area 300e from the central position 300d forms the positional relationship of the set 45° relative to the start point S, the information display cursor 300c is not displayed.

Next, the mouse cursor 300b is moved in the direction as shown in an arrow in FIG. 7.

Every time the certain area 300e of the mouse cursor 300b has a positional relationship so as to form an angle of 45° relative to the start point S and the central position 300d of the mouse cursor 300b, an angular incremental display shape is displayed near the mouse cursor 300b as information display cursor 300c. If a straight line is plotted under the condition that the information display cursor 300c is an angular incremental display, a straight line can be accurately plotted.

Figure 8:
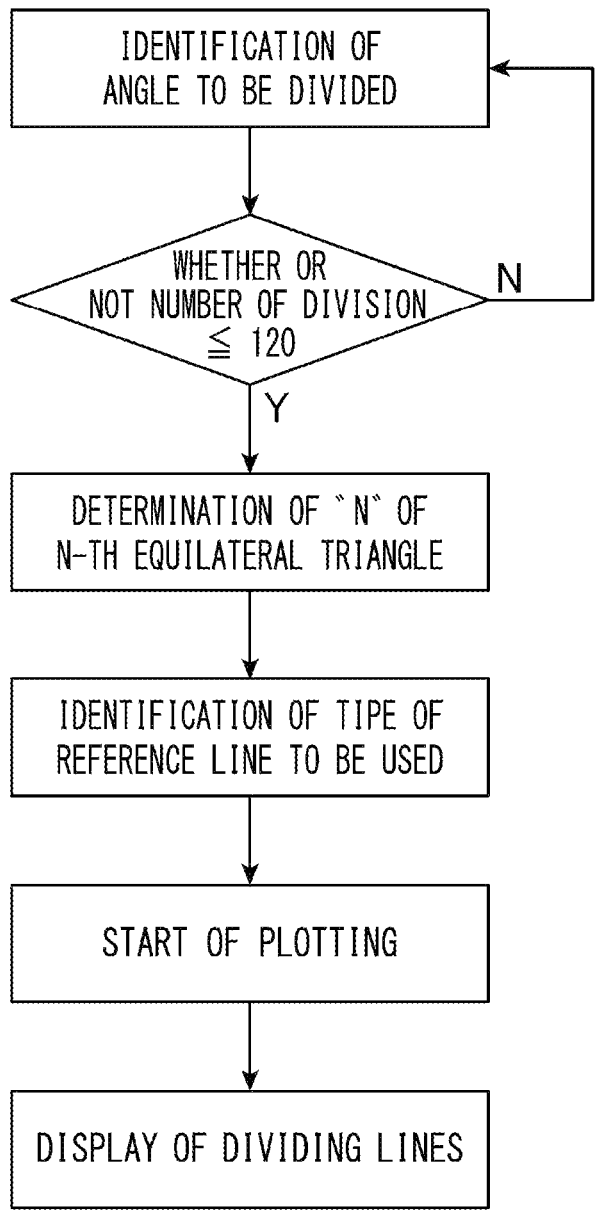
FIG. 8 is a view showing a flowchart of a procedure of the CAD plotting method according to the embodiment of the present invention.

Now, the flowchart for the plotting procedure is explained about, with reference to FIG. 8.

Firstly, the angle XOY to be divided is identified in step 1.

Then, whether or not the number of divisions is equal to, or less than 120 is evaluated in step 2.

If the number of divisions is more than 120, the plotting procedure is returned to step 1, since such a number is out of scope in the present plotting algorithm, and If the number of divisions is equal to, or less than 120, the plotting procedure is proceeded to step 3.

Then, n of the group of n-th equilateral triangles which is utilized in the plotting final target divisional line is identified in step 3.

More specifically, n is determined in accordance with the number of divisions identified by utilizing a table of FIG. 11A and FIG. 11B.

Figure 9A:
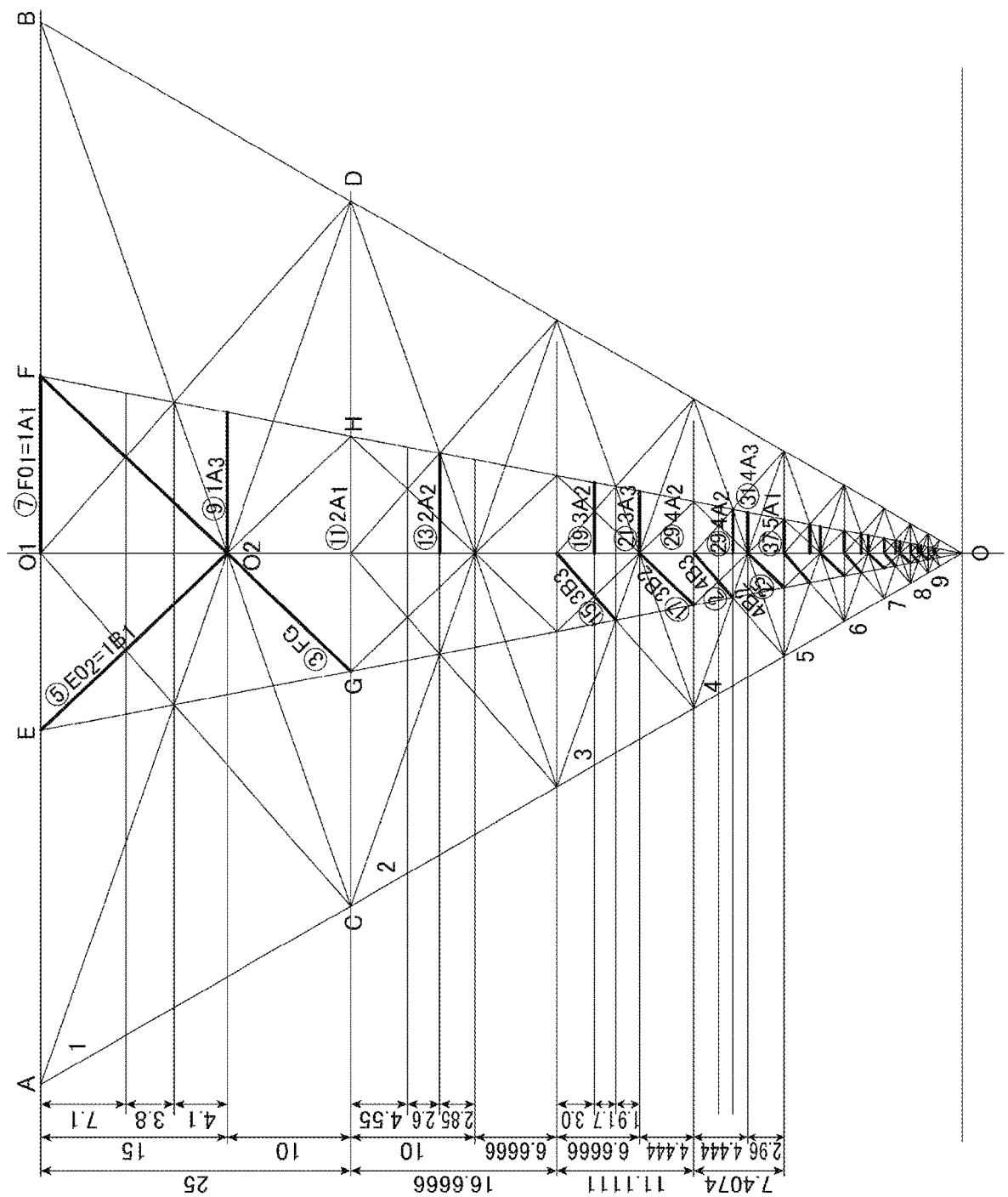

Then, the kind of the group of the reference straight lines in the determined n-th equilateral triangle is identified in step 4. More specifically, as shown in FIGS. 9A and 9B, the group of the reference straight lines is classified as the straight lines (shown as symbol 'A' in FIGS. 9A and 9B) in parallel to the bottom side AB of the first equilateral triangle ABO and the straight lines (shown as symbol 'B' in FIGS. 9A and 9B) diagonal to the bottom side AB of the first equilateral triangle ABO.

Then, an algorithm for plotting the division of XOY is started in step 5. Then, the plotted divisional straight lines by the above algorithm are displayed, which completes the plotting operation, in step 6.

In this connection, in FIGS. 10A and 10B, an example of the group of the straight lines in case of the first equilateral triangle A1B1O' is shown.

FIGS. 15A and 15B are views showing the plotted drawing displayed on the screen by the present CAD plotting procedure in a case where an angle XOY to be divided is 60° and the number of the divisions is 3.

As shown in FIG. 15A(B), points $A_1$, $B_1$ on straight lines OX, OY, respectively, are sought so as to have a relationship $OA_1=OB_1$, and points $A_1$, $B_1$ are connected to form a triangle $A_1OB_1$.

Then, as shown in FIG. 15A(B), an equilateral triangle $A_1B_1O'$ one side of which is $A_1B_1$ is formed.

Then, as shown in FIG. 15A(B), points at which a straight line, which passes on the central point of $O_{11}$ of a circle which circumscribes the equilateral triangle $A_1B_1O'$ in parallel to $A_1B_1$, intersect AO' and BO', respectively, are sought as $A_2$ and $B_2$.

On the other hand, the central point $O_{12}$ of $A_1B_1$ is sought, and points at which $A_2B_1$, $A_1B_2$ intersect $B_2O_{12}$, $A_2O_{12}$, respectively, are sought as points $C_1'$ and $C_1$.

Then, as shown in FIG. 15A(B), points at which extension lines of $O'C_1$, $O'C_1'$ intersect $A_1B_1$, are sought as points $E_1$, $E_1'$, so that $A_1B_1$ is equally divided into three parts by $E_1$, $E_1'$.

Then, as shown in FIG. 15A(B), a point $F_1$ at which $A_2B_2$ intersect $O'C_1$, and a point $F_1'$ at which $A_2B_2$ intersect $O'C_1'$ are sought, respectively.

Then, as shown in FIG. 15B(C), points a, b on the circumscribed circle are sought in such a way that the distance between A, B and a, b, respectively, are $F_1E_1'$ or $F_1'E_1$, and points I, J at which aO' and bO' intersect $A_1B_1$, respectively, are sought.

Then, as shown in FIG. 15B(D), straight lines OI and OJ are drawn, so that the angles XOI, IOJ, and JOY corresponds to a one-third of the angle XOY, respectively. These steps complete the plotting procedure.

FIGS. 12A and 12B show a plotting procedure in a case where the angle XOY to be divided is 47°, and the number of the division is 17.

Unlike the above case (FIGS. 15A, 15B) in which the angle XOY to be divided is 60°, and the number of the division is 3, n of the equilateral triangle AnBnO is 3, and the plotting error is within 1%, which is practicably acceptable level.

Figure 13:
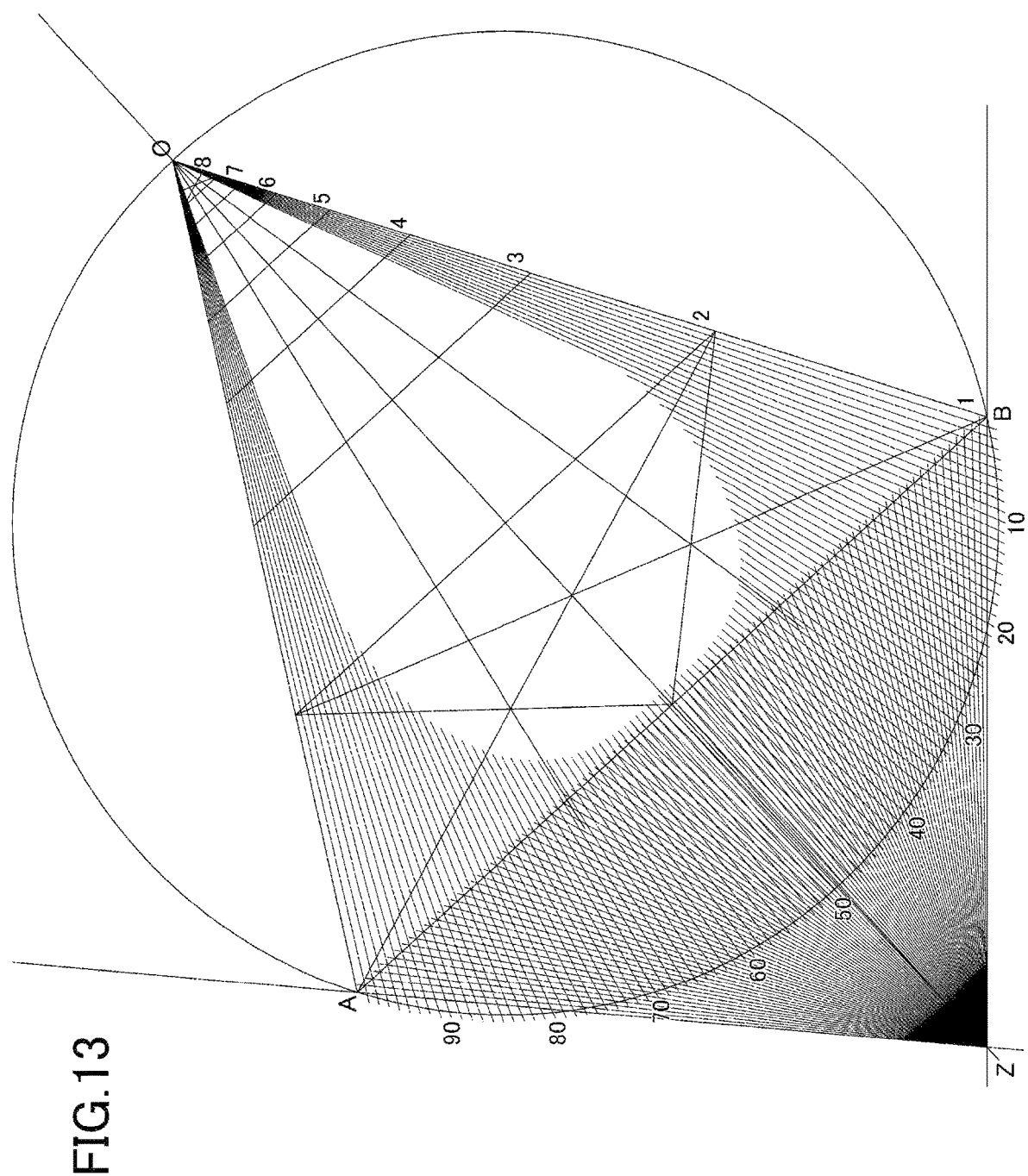
FIG. 13 is a view showing a CAD plotting procedure in a case where the angle XOY is 85°, and the number of division is 99 in the CAD plotting method according to the present invention.

FIG. 13 is a view showing plotting procedure in a case where the angle XOY to be divided is 85°, and the number of the division is 99. In this case, as shown in FIGS. 11A, 11B, since the number of the division is 99, the reference line to be utilized is 7A2, and the plotting error is within 1%, which is practicably acceptable level.

Figure 14:
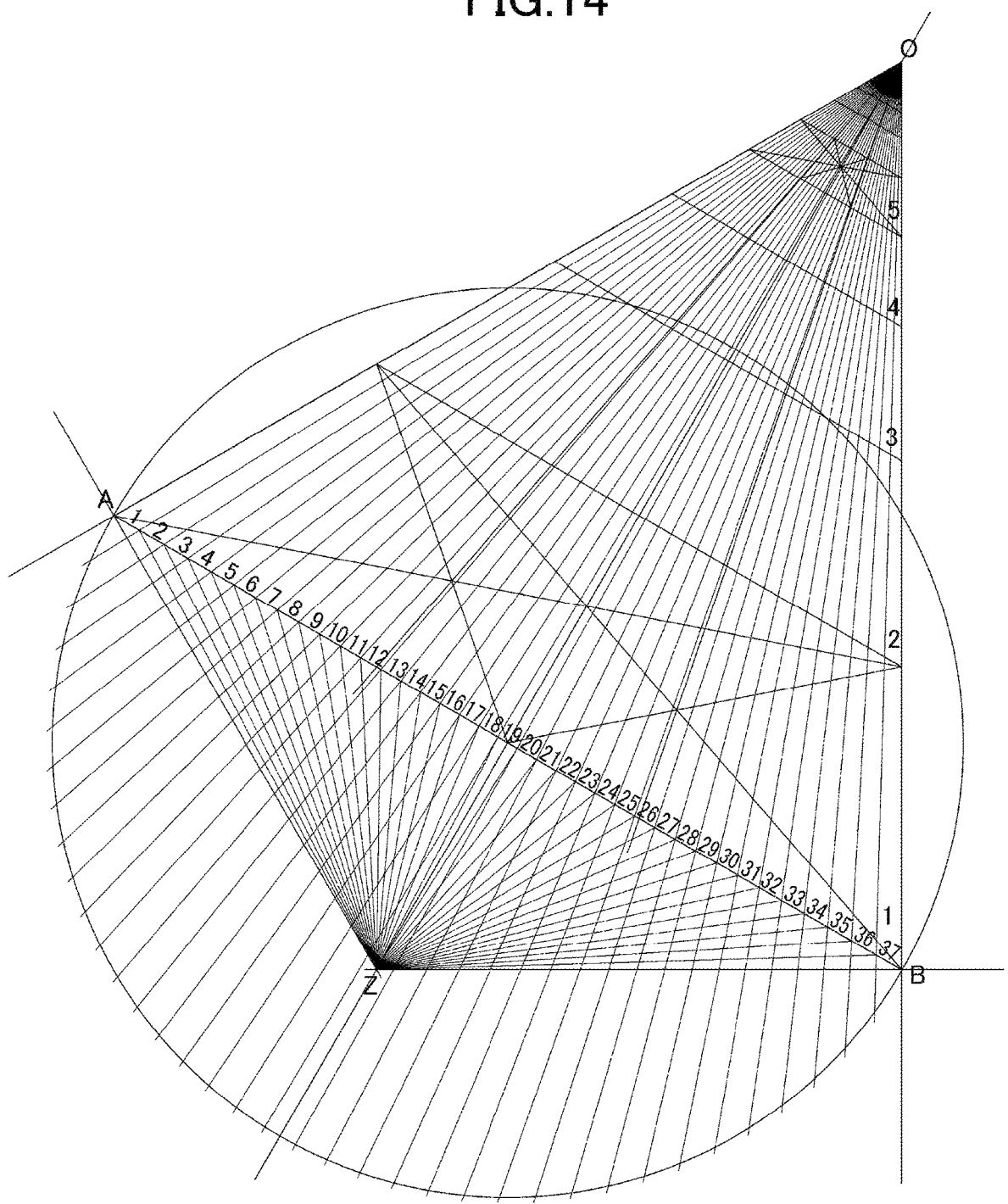
FIG. 14 is a view showing a CAD plotting procedure in a case where the angle XOY is 120°, and the number of division is 37 in the CAD plotting method according to the present invention.

FIG. 14 is a view showing plotting procedure in a case where the angle XOY to be divided is 120°, and the number of the division is 37. In this case, as shown in FIG. 11, since the number of the division is 37, the reference line to be utilized is 5A1, and the plotting error is within 1%, which is practicably acceptable level.

The embodiment of the present invention has been described in detail above. A person skilled in the art may make various modifications and changes insofar as they are not out of the scope of the present invention.

For instance, in the above embodiment, in the CAD plotting method of equally dividing the angle XOY, four examples of the angle XOY 60°, 47°, 85°, 120° were explained about, the angle XOY to be divided is not limited to these above angles.

The present invention can be applicable to any optional angel, as a CAD plotting algorithm, so long as an arcuate section inside AOB of a circle inscribing AOB can be equally divided from the point A, or B into N sections by utilizing the reference line L among a group of the reference lines and connecting O and each of divided points on the circumscribed circle.

What is claimed is:

1. A CAD plotting method of equally dividing an angle XOY between a line OX and a line OY into three sections, comprising:
   providing a CAD system, the CAD system executing:
   a step of seeking points $A_1$, $B_1$ on the line OX and the line OY, respectively, so as to form a relation $OA_1=OB_1$,
   a step of forming a triangle $A_1OB_1$ by connecting a point $A_1$ on the line OX and a point $B_1$ on the line OY,
   a step of forming an equilateral triangle $A_1B_1O'$ whose one side is defined by a line $A_1B_1$,
   a step of drawing a line which passes a center $O_{11}$ of a circle which circumscribes said equilateral triangle $A_1B_1O'$ in parallel with said side $A_1B_1$, seeking points $A_2$, $B_2$ at which said parallel line intersects the line AO' and BO', respectively, and seeking a point $O_{12}$ which is a central point of said side $A_1B_1$,
   a step of seeking points $C_1'$ and $C_1$ at which $A_2B_1$, $A_1B_2$ intersects $B_2O_{12}$, $A_2O_{12}$, respectively,
   a step of seeking points $E_1'$ and $E_1$ at which extension lines of $O'C_1$, $O'C_1'$ intersect $A_1B_1$, whereby said side $A_1B_1$ is trisected by said points $E_1'$ and $E_1$,
   a step of seeking a point $F_1$ at which a line $A_2B_2$ intersects said line $O'C_1$, and a point $F_1'$ at which a line $A_2B_2$ intersects said line $O'C_1'$
   a step of seeking points a, b on the circumscribed circle so as to be separated from A, B with a distance corresponding to $F_1E_1'$, or $F_1'E_1$, respectively,
   a step of seeking points I, J at which the lines aO', bO' intersect the side $A_1$, $B_1$, respectively, and
   a step of drawing lines OI, OJ, whereby each of angles XOI, IOJ, and JOY corresponds to the trisection angle of XOY.

2. A CAD plotting method of equally dividing an angle XOY between a line OX and a line OY into N sections, comprising:

providing a CAD system, the CAD system executing:

a step of seeking points $A_1$, $B_1$ on the line OX and the line OY, respectively, so as to form a relation $OA_1=OB_1$, a step of forming a triangle $A_1OB_1$ by connecting a point $A_1$ on the line OX and a point $B_1$1 on the line OY, a step of forming an equilateral triangle $A_1B_1O'$ whose one side is defined by a line $A_1B_1$, a step of drawing a line which passes a center $O_{11}$ of a circle which circumscribes said equilateral triangle $A_1B_1O'$ in parallel with said side $A_1B_1$, seeking points $A_2$, $B_2$ at which said parallel line intersects the line AO' and BO', respectively, and seeking a point $O_{12}$ which is a central point of said side $A_1B_1$, a step of seeking points $C'_1$ and $C_1$ at which $A_2B_1$, $A_1B_1$, $A_1B_2$ intersects $B_2O_{12}$, $A_2O_{12}$, respectively, a step of seeking points $E'_1$ and $E_1$ at which extension lines of $O'C_1$, $O'C'_1$ intersect $A_1B_1$, whereby said side $A_1B_1$ is trisected by said points $E'_1$ and $E_1$, a step of seeking a point $F_1$ at which a line $A_2B_2$ intersects said line $O'C_1$, and a point $F'_1$ at which a line $A_2B_2$ intersects said line $O'C'_1$ a step of seeking a point $O_{13}$ at which the line $O'O_{12}$ intersects the side $A_1B_2$ or the side $A_2B_1$, and seeking $G_1$, $G'_1$ at which a line passing the point $O_{13}$ in parallel with the side $A_1B_1$ intersects O'E, O'E', respectively, a step of extracting $O_{21}C_1$, $O_{13}F_1$, $O_{13}E_1$, $O_{12}E_1$, $O_{13}G_1$ and $C'_1C_1$ as a second group of diagonal lines relative to the side $A_1B_1$, in said equilateral triangle $A_1B_1O'$, a step of determining n for the equilateral triangle AnBnO', in accordance with predetermined division number N, and plotting the equilateral triangles $A_1B_1O'$ to AnBnO', a step of selecting either of the first group of straight lines or the second group of straight lines and selecting either of straight lines in the selected group to determine the reference line L, a step of dividing an arc of said circumscribed circle within said triangle $A_1OB_1$ into N parts by using said determined reference line L from $A_1$ or $B_1$, and a step of connecting between each of divided points on the arc of the circumscribed circle, and said point O, whereby said angle XOY is equally divided into N parts.

3. The CAD plotting method according to claim 2, wherein said step of plotting said equilateral triangle AnBnO' includes a step of positioning said point O' to be an opposite said to said point O relative to said line AB.

4. The CAD plotting method according to claim 2, wherein said step of plotting the equilateral triangles $A_1B_1O'$ to AnBnO' includes a step of plotting either of said equilateral triangle in a magnifying manner by utilizing a zoom up function.

* * * * *